United States Patent [19]

Castera et al.

[11] 4,341,998
[45] Jul. 27, 1982

[54] MAGNETOSTATIC WAVE MAGNETOMETER

[75] Inventors: Jean P. Castera; Pierre Hartemann, both of Paris, France

[73] Assignee: Thomson-CSF, Paris, France

[21] Appl. No.: 124,076

[22] Filed: Feb. 25, 1980

[30] Foreign Application Priority Data

Feb. 27, 1979 [FR] France ................. 79 05006

[51] Int. Cl.³ ....................... G01R 33/02; H03B 21/00
[52] U.S. Cl. ..................................... 324/244; 324/249; 324/250; 331/65; 331/107 A
[58] Field of Search ........................ 324/244, 248–252, 324/259, 260; 331/37, 46, 56, 64, 65, 96, 107 A

[56] References Cited

U.S. PATENT DOCUMENTS

| 2,972,105 | 2/1961 | Ghose | 324/250 |
| 3,878,477 | 4/1975 | Dias et al. | 331/65 X |
| 3,895,912 | 7/1975 | Naumann | 331/65 X |
| 4,028,639 | 6/1977 | Hagon et al. | 331/96 X |
| 4,107,626 | 8/1978 | Kiewit | 331/65 |

FOREIGN PATENT DOCUMENTS 14115 8/1980 European Pat. Off. ........ 331/107 A

OTHER PUBLICATIONS

Miller et al., *Tunable Magnetostatic Surface-Wave Oscillator*, Electronic Letters, Apr. 29, 1976, vol. 12, No. 9, pp. 209, 210.

Thomsen-CSF, Surface-Acoustic Wave-Oscillator Tuned by Magneto-Elastic Effect, Electr. Letter, vol. 13, No. 19, Sep. 15, 1977, pp. 588–590.

*Primary Examiner*—Gerard R. Strecker
*Attorney, Agent, or Firm*—Oblon, Fisher, Spivak, McClelland & Maier

[57] ABSTRACT

A unidirectional magnetometer comprising at least two magnetostatic wave oscillators with resonators or delay lines, made in two portions in a magnetic material layer respectively subject to the field to be measured and to given magnetic fields of the same direction, but of opposite sense and adjacent intensities.

9 Claims, 5 Drawing Figures

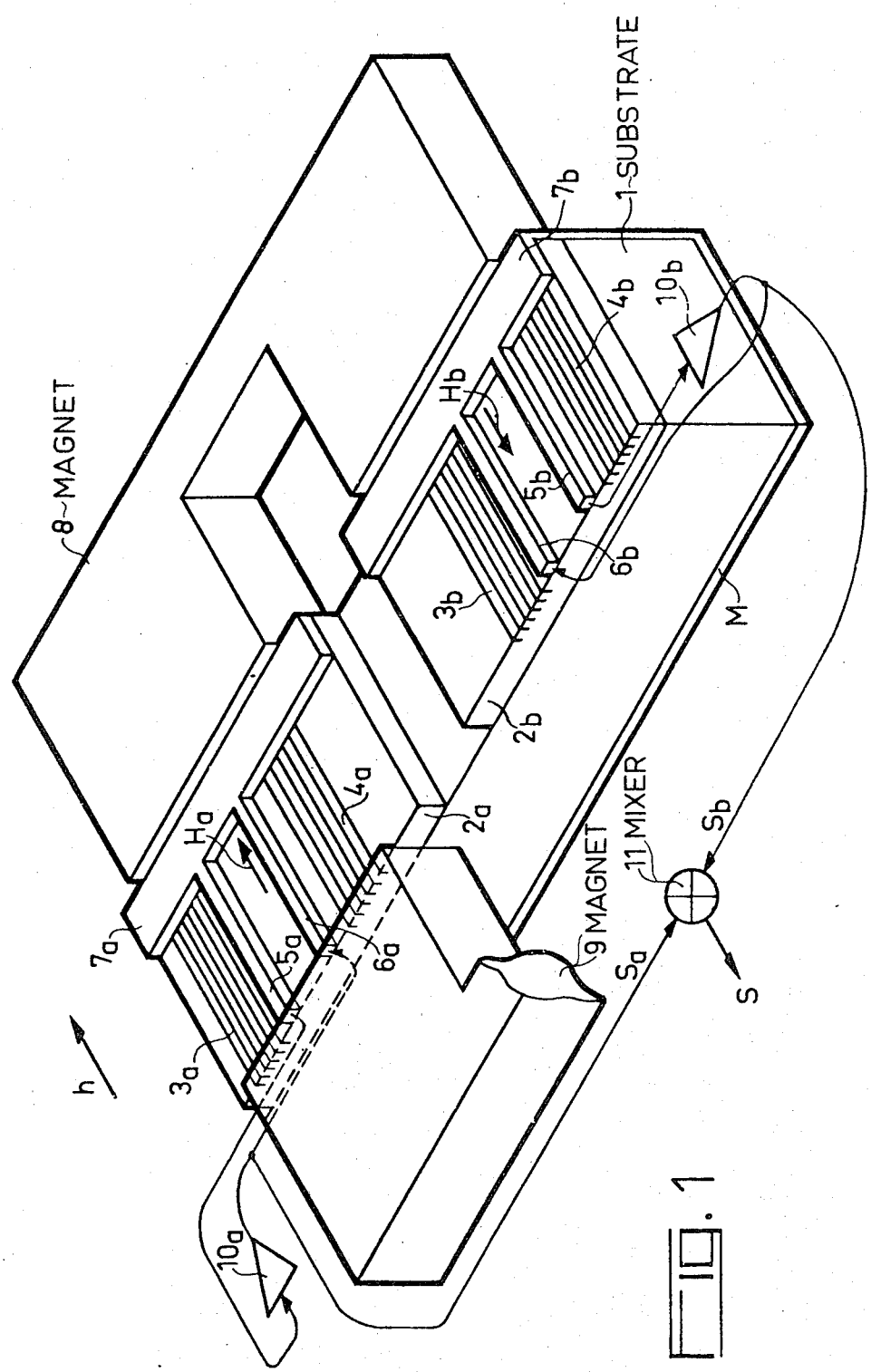

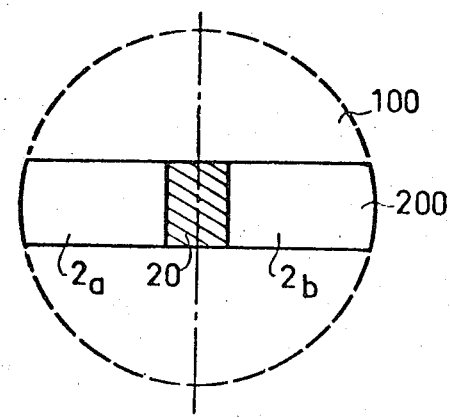
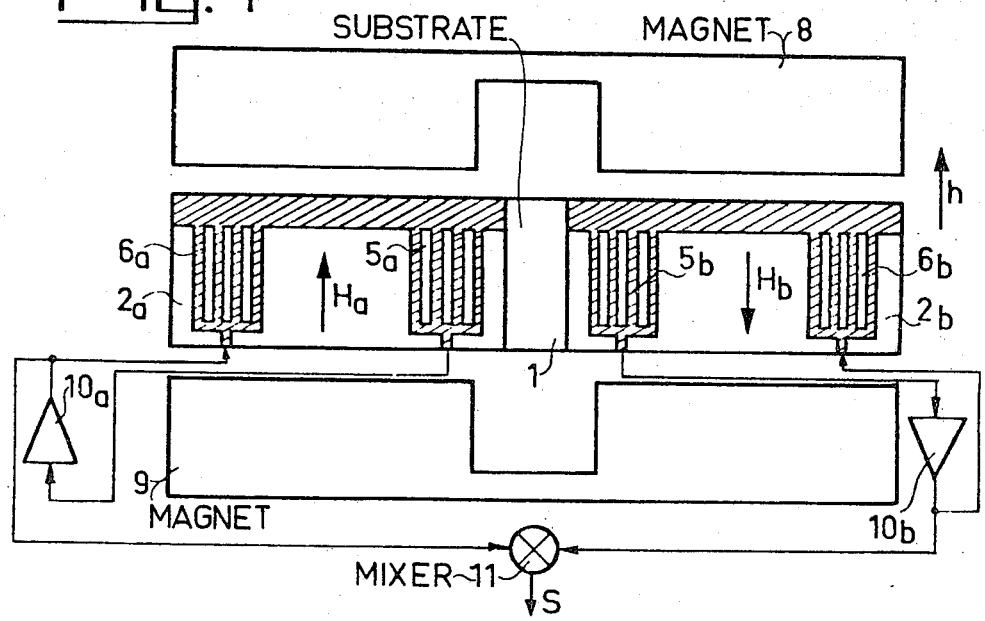
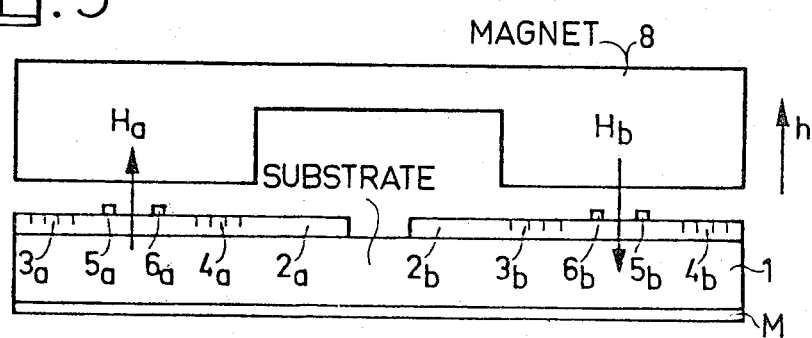

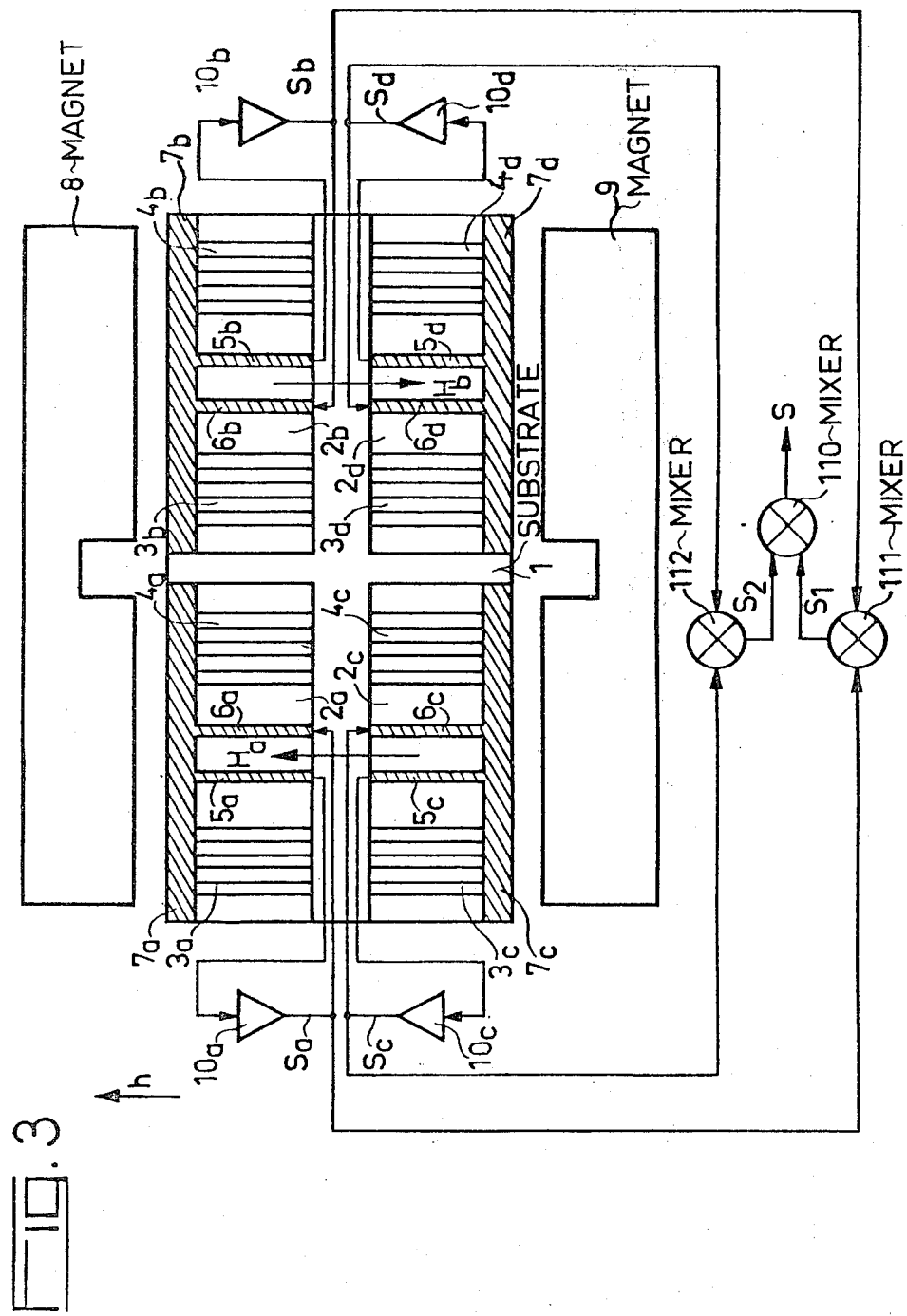

MAGNETOSTATIC WAVE MAGNETOMETER

BACKGROUND OF THE INVENTION

The present invention relates to a unidirectional magnetostatic wave magnetometer, i.e. substantially sensitive to a component of an external magnetic field.

Among the known magnetometers, certain of them are sensitive to the intensity of the magnetic field, for example optical pumping magnetometers. Others are unidirectional, i.e. they supply a signal which is proportional to the component of the field in a given direction. The latter type of magnetometer generally utilises the displacement of a conductor in a magnetic field, which induces an electrical voltage. The conductor is generally fragile. Movements lead to wear and prior adjustments are necessary.

BRIEF SUMMARY OF THE INVENTION

The invention aims at obviating these disadvantages by a monolithic device, which is easy to construct and which supplies a signal, whose frequency varies with the field component, which leads to easy data acquisition. The invention utilises magnetostatic waves which can be transmitted in a thin layer of a magnetic material placed in an external magnetic field. These waves can be excited by means of a transducer in which circulates an ultra-high frequency current. It is known to use them for constructing an oscillator incorporating either a delay line between two transducers and looped by means of an amplifier, or a cavity resonator with gratings. The oscillating frequencies obtained are in the ultra-high frequency range and are dependent on the external magnetic field value. When the dependence law has been determined, it is possible to use such oscillators for measuring magnetic field variations which are superimposed on a constant magnetic field. When these variations are relatively small, the dependence law is linear and the measurement of the frequency variation of the output signal is then proportional to the variation of the magnetic field component to which the oscillator is sensitive. The magnetometer according to the invention comprises two oscillators subject to constant magnetic fields of similar intensities and of the same direction, but of opposite senses, on which is superimposed the magnetic field to be measured, which is identical for both oscillators. The output signals of the two oscillators are mixed in such a way as to obtain a signal, whose frequency is equal to the difference of the two oscillating frequencies. This configuration makes it possible to reduce the working frequency from the ultra-high frequency range to a much lower range. Moreover, as the oscillators are made from the same magnetic material layer, the device can be made symmetrical and temperature effects are compensated. Finally, the frequency variation of the output signal is doubled compared with the variation of each of the two oscillating frequencies.

BRIEF DESCRIPTION OF THE DRAWINGS

The invention is described in greater detail hereinafter relative to non-limitative embodiments and the attached drawings, wherein show:

FIG. 1 a surface magnetostatic wave magnetometer formed by two resonators.

FIG. 2 the manufacture of the device of FIG. 1.

FIG. 3 an embodiment of the magnetometer permitting an improvement to the compensation to the temperature variations.

FIG. 4 a plan view of a surface magnetostatic wave magnetometer incorporating two delay lines.

FIG. 5 a sectional view of a volume magnetostatic wave magnetometer incorporating two resonators.

DETAILED DESCRIPTION OF THE PREFERRED EMBODIMENTS

The device shown in FIG. 1 is a magnetometer with two cavity resonators using surface magnetostatic waves. This device comprises the following components: A substrate 1 made from a non-magnetic garnet, for example a gadolinium-gallium garnet (GGG). A magnetic layer deposited on the substrate and formed by two portions 2a and 2b, for example constituted by an yttrium-iron garnet (YIG) deposited by liquid phase epitaxy. Two U-shaped magnets 8, 9, each enclosing magnetic layers 2a, 2b in such a way as to create therein constant fields of the same direction and opposite sense, respectively Ha, Hb. A single magnet could be sufficient to create these fields, for example magnet 8. The direction of fields Ha and Hb is selected so as to permit the transmission of surface waves in the magnetic layer. Thus, this direction is in the plane of the layer and is perpendicular to the transmission direction. In each of the two layers 2a, 2b is created a cavity resonator by means of systems of grooves in the layer 3a, 4a and 3b, 4b and input and output transducers 5a, 6a and 5b, 6b. Each transducer is formed by a narrow metallic strip deposited on the magnetic layer, whose one end is connected to a mass plane M located in the lower part of the substrate, said layer being extended on one side of the substrate and covering part of the layers 2a, 2b in the form of deposits 7a, 7b. The grooves of the gratings and the metallic strips constituting the transducers are parallel to the field Ha, Hb in such a way as to permit the transmission of surface waves in the perpendicular direction. It is known that surface magnetostatic waves are unidirectional, i.e. they are transmitted exclusively at the YIG-air interface in one of the transmission directions and at the YIG-GGG interface in the other direction, said directions being dependent on the direction of the magnetic field applied. Thus, the transmission directions are reversed for the two cavities, because the magnetic fields Ha and Hb are of opposite directions. Transducers 5a, 5b and 6a, 6b are positioned in such a way that transducers 6a and 6b are input transducers, i.e. receive an ultra-high frequency current and couple the magnetostatic waves in the direction of grating 4a and grating 3b respectively, whilst transducers 5a and 5b are output transducers, i.e. receive the waves from gratings 3a and 4b respectively and convert the energy into an ultra-high frequency current. The ultra-high frequency signals received by the input transducers 6a and 6b respectively come from negative resistance amplifiers circuits 10a, 10b, whose inputs are respectively connected to the output transducers 5a, 5b. The signals from the amplifiers Sa and Sb are mixed by means of a mixer 11, which supplies a signal S, whose frequency is equal to the difference of the frequencies of signals Sa, Sb.

The device operates in the following manner. In the absence of magnetic fields added to the fields created by the magnets, signal Sa has a frequency Fa and signal Sb a frequency Fb. The output signal S has a frequency Fa-Fb which can be adjusted to the desired value, for example, by moving the magnets. When the device is subject to a magnetic field H parallel to the fields created by the magnets, said field H is added in intensity to one of the fields Ha, Hb and is subtracted in intensity from the other, for example layer 2a is subject to a field Ha+h and layer 2b is subject to a field Hb-h. It is known that the oscillating frequencies of a magnetostatic wave oscillator vary with the magnetic field in the same sense. Signal Sa consequently has the frequency Fa+ΔFa and signal Sb the frequency Fb-ΔFb. If the frequencies Fa and Fb are close to one another and if the variation ΔFa and ΔFb are small compared with the frequencies Fa and Fb, the frequency-magnetic field dependence relationships can be considered as linear and the variations ΔFa and ΔFb are approximately equal. The output signal S has a frequency Fa-Fb+2ΔF. If the field h has a direction which differs from that of the induced surface waves, bulk waves are induced simultaneously to the surface waves due to the two components; perpendicular to the plane of the layer and in the plane of the layer parallel to the transmission direction. However, these bulk waves are in frequency ranges which differ widely from those of the surface magnetostatic waves and consequently do not influence the output signal. The difference Fa-Fb can be adjusted to a convenient value for the measurement either by modifying the fields Ha and Hb by slightly moving the magnets, or by acting on the transmission time in the amplifier connecting cables, i.e. by modifying the length thereof. The field h to be measured can be continuous or alternating, for example of frequency f, in which case the signal S is modulated in frequency.

The above description of the operation does not take account of the fact that the oscillators generally have a number of oscillating frequencies. Thus, in the resonant pass band of a cavity, there are a plurality of frequency modes separated by a value equal to v/2L in which L is the equivalent length of the cavity and v the velocity of the magnetostatic waves in the magnetic layer. In order to obtain a monomode oscillator it is possible to increase the variation between the modes by reducing the equivalent length of the cavity, which has the effect of also reducing the quality coefficient, or decrease the band width by increasing the number of grooves in each grating or system, but this implies an increase in the equivalent length, i.e. a reduction in the variation between the modes. A compromise can be found between the two in such a way as to obtain a band width which is just equal to the variation between the modes. The invention can be realised with a 10 μm thick YIG layer in which the measured saturation magnetization is $4\pi M = 1750$ Oe. 2.8 μm deep grooves have been engraved in this layer by ion bombardment. Fields $H_a$ and $H_b$ are equal to approximately 200 Oe, the oscillating frequencies $F_a$ and $F_b$ are approximately 2.25 GHz and the sensitivity of this device is approximately 4 MHz/Oe. It is possible to measure a frequency difference of a few dozen Hz, which corresponds to a resolution of approximately $10^{-5}$Oe.

In order that the temperature drifts due to the magnetization variations as a function of temperature are compensated between the two oscillators, it is necessary for the device of FIG. 1 to be symmetrical in such a way that the two oscillators have variations which are as close to one another as possible.

FIG. 2 illustrates the recommended construction of the two oscillators. A GGG disk is used on which is deposited by liquid phase epitaxy a layer of a given thickness of YIG 100. Epitaxy is carried out in a circular manner, so that the disk has a centre of symmetry. A parallelepiped is cut from the centre of the disk and this has an axis of symmetry passing through the centre. In the centre of the parallelepiped the YIG is removed by sand blasting over an area 20 in such a way as to separate the two parts of the YIG layer 2a and 2b on which are made the two cavities by engraving gratings and depositing input and output transducers. The engraving and depositing accuracy can be very good as a result of techniques presently used in microlithography making it possible to obtain symmetry between the two cavities, which can have very close temperature responses. On assuming that the temperature is the same for the two parts of the device, when said temperature varies, the magnetization of the YIG also varies, it being reduced when the temperature increases. When the magnetization decreases, the oscillating frequencies of the two cavities also decrease. If the frequency variations are equal for the two parts, the effects cancel one another out on mixing signals Sa and Sb. According to the applications of this magnetometer, the temperature compensation obtained in the manner indicated hereinbefore can be adequate. However, in certain cases, the temperature variations or precision required in connection with the measurement of the magnetic field are too great for this compensation to be adequate. This problem can be obviated in various ways. In order to obtain a strictly uniform temperature over the entire device, it can be of interest to place the entire parallelepiped 200 in liquid, for example oil having a good thermal inertia.

Another way to improve the compensation of the temperature variations is shown in FIG. 3, which is a plan view of a magnetometer comprising four cavity resonator oscillators on the same GGG substrate 1 on which is deposited a YIG layer subdivided into four portions 2a, 2b, 2c, 2d separated from one another by zones obtained by sand blasting, as indicated hereinbefore. Thus, the device is double that of FIG. 1. These cavities are formed on portions 2a, 2b, 2c, 2d respectively by means of pairs of gratings 3a-4a; 3v-4b; 3c-4c; 4c-4d and are looped by amplifier circuits 10a, 10b, 10c, 10d supplying signals Sa, Sb, Sc, Sd respectively between input-transducers 5a-6a; 5b-6b; 5c-6c; 5d-6d. The system is placed in the magnetic fields of two magnets 8 and 9 arranged in accordance with FIG. 1 and supplying fields of opposite senses, namely Ha for portions 2a and 2c and Hb for portions 2b and 2d. The signals Sa and Sb are mixed in a mixer 111 supplying a signal S1 and signals Sc and Sd are mixed in a mixer 112 supplying a signal S2. Signals S1 and S2 are applied to a mixer 112 supplying the output signal S permitting the measurement of the external magnetic field h. Assuming that the field h to be measured is in the same sense as field Ha, the frequencies of signals Sa and Sc vary in the same sense as the intensity of field h, whilst the frequencies of signals Sb, Sd vary in the opposite sense. If for a given field the variations are all equal in absolute value, the total frequency variation of signal S is equal to four times the frequency variation of a single oscillator. If this is not the case, the frequency variations due to a temperature variation have the same sign for the four oscillators. The relative frequency variation compared with the temperature variation of signal S is equal to the product of the relative variations of signals S1 and S2. Thus, an improvement by a considerable factor is obtained compared with a device having only one pair of oscillators. It is possible to choose oscillating frequencies in the absence of external magnetic fields in the following manner: $Fa=Fc$, $Fd>Fa>Fb$. The frequency of the signal F is equal to $F=Fa-Fb+Fc-Fd$. When a variation $\Delta F$ is due to a magnetic field, the frequency becomes $Fa-Fb+Fc-Fd+4\Delta F$. The exact values of these frequencies can be adjusted by acting on the delays introduced by amplifier loops.

Other embodiments of magnetometers comprising at least two oscillators are shown in FIGS. 4 and 5. FIG. 4 shows a magnetometer having two delay line oscillators using surface waves. The delay lines are realised on two portions 2a and 2b of a YIG layer deposited on a GGG substrate 1 as indicated hereinbefore. The magnetic fields Ha and Hb are obtained in the same way as indicated hereinbefore and the delay lines are looped by amplifiers 10a and 10b. In order to obtain a monomode operation, the signal inputs-outputs are obtained in the lines by multiple, parallel-arranged transducers 5a, 5b and 5b, 6b. However, this type of magnetometer has less advantageous characteristics than a resonator magnetometer due to the fact that the quality coefficient of a delay line oscillator is for the same oscillating frequency, lower than that of a resonator oscillator.

FIG. 5 shows a magnetometer using bulk waves. One way in which bulk waves can be obtained is to subject the YIG layer to a field perpendicular to its surface. Thus, a magnet 8 is placed above the two portions 2a, 2b of the YIG layer. The magnetometer shown is a resonator magnetometer. Its operation is similar to that of surface wave magnetometers. The sensitivities obtained, as well as the nominal frequency values, differ. It would thus be possible to obtain a bulk wave oscillator with a magnetic field parallel to the wave transmission direction. The advantage of the magnetometer of FIG. 5 is that it is much more compact than those obtainable with fields parallel to the layer. Such limited overall dimensions can be of great interest in a certain number of applications.

The invention is not limited to the embodiments described and represented hereinbefore and various modifications can be made thereto without passing beyond the scope of the invention.

What is claimed is:

1. A magnetostatic wave magnetometer for measuring a field comprising:
    at least two magnetostatic wave oscillators each having a magnetic material layer subject to the action of said field to be measured and said oscillators having inductor means for subjecting said layers respectively to given magnetic fields of maximum sensitivity direction, opposite senses and similar intensities with each of said oscillators producing an output signal whose frequency shift is proportional to the change undergone by its given magnetic field in response to said field to be measured wherein in the absence of said field to be measured the frequencies of the output signals of each of said oscillators are similar; and
    mixer means having two inputs respectively connected to said oscillators for receiving said output signals and supplying a signal whose frequency is equal to the difference between the oscillation frequencies of said two oscillators and is variable as a function of the component of said field to be measured in said direction, whereby said supplied signal is at a lower frequency range than said oscillator output signals.

2. A magnetometer according to claim 1, wherein it also comprises a non-magnetic substrate on which are deposited the said magnetic layers, the oscillators also incorporating magnetostatic wave transducers placed on the layers in such a way that the wave transmission directions in the layers are parallel to one another.

3. A magnetometer according to claim 1, wherein it comprises four oscillators, whose layers are respectively subject in pairwise manner to fields of the same sense, the mixer means comprising a first and a second mixer respectively connected to two oscillators whose layers are subject to fields of opposite directions and a third mixer having inputs respectively connected to the outputs of the two first mixers.

4. A magnetometer according to claim 2, wherein the given fields are parallel to the plane of the layer and perpendicular to the wave transmission direction in the layers in such a way as to induce surface magnetostatic waves.

5. A magnetometer according to claim 2, wherein the given fields are parallel to the wave transmission direction.

6. A magnetometer according to claim 2, wherein the given fields are perpendicular to the plane of the layer.

7. A magnetometer according to claim 1, wherein the magnetic material is an yttrium-iron garnet epitaxially deposited on a gadolinium-gallium garnet substrate.

8. A magnetometer according to claim 1, wherein each layer incorporates a cavity resonator with gratings.

9. A magnetometer according to claim 1, wherein each layer incorporates a delay line.

* * * * *